United States Patent [19]

Perner

[11] Patent Number: 5,097,206

[45] Date of Patent: Mar. 17, 1992

[54] BUILT-IN TEST CIRCUIT FOR STATIC CMOS CIRCUITS

[75] Inventor: Frederick A. Perner, Palo Alto, Calif.

[73] Assignee: Hewlett-Packard Company, Palo Alto, Calif.

[21] Appl. No.: 593,703

[22] Filed: Oct. 5, 1990

[51] Int. Cl.⁵ .................. G01R 31/28; G06F 11/00
[52] U.S. Cl. ................... 324/158 R; 324/73.1; 371/22.5; 371/29.5
[58] Field of Search ............ 324/158 R, 73.1; 371/21.3, 21.4, 22.5, 22.6, 28.1, 27, 29.5

[56] References Cited

U.S. PATENT DOCUMENTS

| | | | |
|---|---|---|---|
| 4,631,724 | 12/1986 | Shimizu | 371/27 |
| 4,637,020 | 1/1987 | Schinabeck | 371/25.1 |
| 4,710,704 | 12/1987 | Ando | 371/25.1 |
| 4,820,974 | 4/1989 | Katsura et al. | 371/21.3 |

OTHER PUBLICATIONS

Phil Nigh and Wojciech Maly, "A Self-testing ALU Using Built-in Current Sensing", 1989, *IEEE Custom Integrated Circuits Conference*, pp. 22.1.1–22.1.4.

Primary Examiner—Ernest F. Karlsen

[57] ABSTRACT

A built-in test circuit configuration for row based static CMOS integrated circuits using a control circuit and a plurality of switching circuits, each connecting VDD to a row power buss through a large pass transistor during normal operating modes and through a low current pull up transistor during the test mode of operation. Defect induced currents are detected by the OR'd outputs of the switching circuits connected to an OR function formed in the control circuit. Additional switching circuits are provided for supplying multiple main power supplies to each integrated circuit row. The switching and additional switching circuits may be physically configured beneath row end caps.

10 Claims, 2 Drawing Sheets

BUILT-IN TEST CIRCUIT FOR STATIC CMOS CIRCUITS

BACKGROUND OF THE INVENTION

1. Field of the Invention

This invention relates to static CMOS logic integrated circuits with built in test circuitry, including those configured from semi-custom chips in a row based, standard cell arrangement.

2. Description of the Prior Art

A built-in test circuit (BITC) for the self testing of an arithmetic logic unit is discussed in an article by Phil Nigh and Wojciech Maly entitled "A Self-testing ALU Using Built-In Current Sensing"; *IEEE Custom Integrated Circuits Conference:* pp 22.1.1–22.1.4, 1989. This article describes a current sensor placed in series with circuit ground for static current testing in a conventional CMOS circuit. What is needed is a BICT design suitable for use with semi-custom, standard cell design CMOS circuits.

SUMMARY OF THE INVENTION

The preceding and other shortcomings of the prior art are addressed and overcome by the present invention that provides an integrated circuit with built-in current testing including main power buss means for supplying voltage to the integrated circuit, row power buss means for applying power from the main power buss means to a first portion of the integrated circuit, switching circuit means operable in normal and test modes to provide a connection between the main and row power buss means, and control circuit means responsive to the impedance of the first portion of the integrated circuit in the test mode for detecting defect induced currents therein.

In a further aspect, the present invention provides a method of current testing an integrated circuit by applying a supply voltage to the integrated circuit, applying power from the supply voltage to a first portion of the integrated circuit through a switching circuit, operating the switching circuit in normal and test modes, and detecting defect induced currents in the first portion of the integrated circuit during the test mode.

These and other features and advantages of this invention will become further apparent from the detailed description that follows which is accompanied by a set of drawing figures. In the figures and description, numerals indicate the various features of the invention, like numerals referring to like features throughout both the drawings and the description.

DETAILED DESCRIPTION OF THE PREFERRED EMBODIMENT(S)

Figure 1:
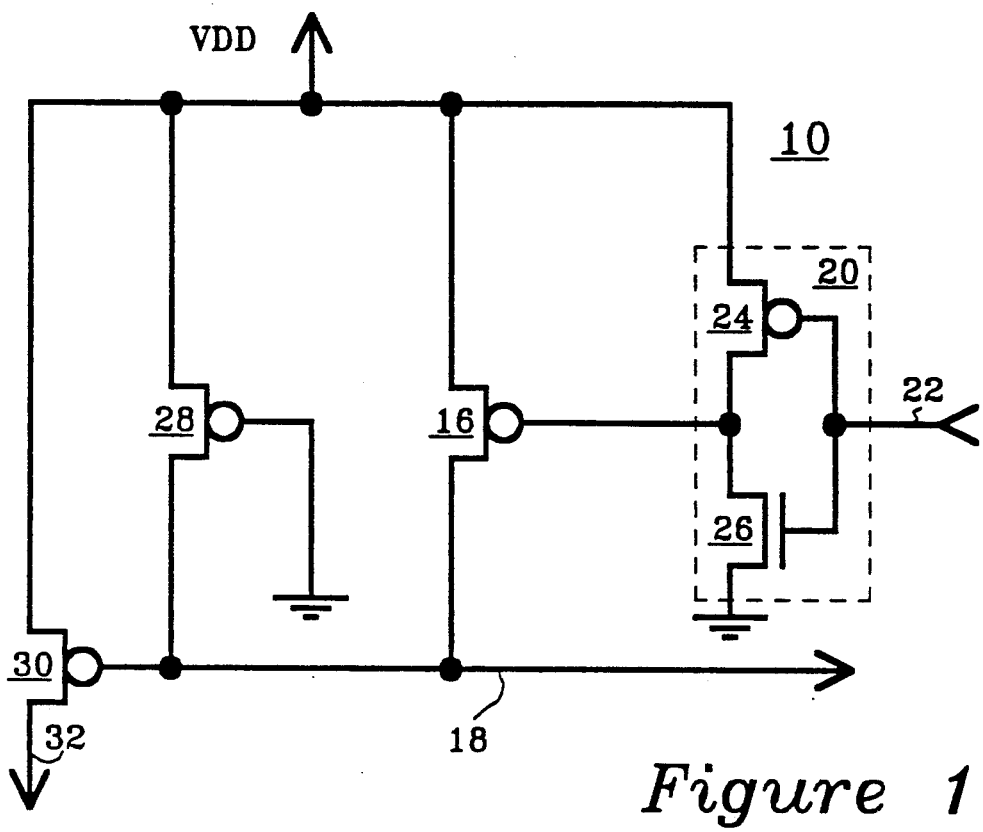
FIG. 1 is a schematic illustration of switching circuit 10 which forms the switching portion of the test circuit for use in providing BICT capabilities for standard cell, semi-custom integrated circuits in accordance with the present invention.

In accordance with the present invention, FIG. 1 is a schematic illustration of switching circuit 10, the switching portion of a test circuit which may be configured within an integrated circuit containing static CMOS logic circuits to detect abnormal behavior therein caused by design, manufacturing or other defects.

Switching circuit 10 is connected in series between VDD, the main power buss, and the row power buss which supplies power to the standard cells in a row. It is operable in two modes, the normal mode and a test mode.

In the normal mode of operation, test clock signal 22, applied to the input of test clock signal buffer 20, is high. Transistors 24 and 26, within test clock signal buffer 20, respond to test clock high signal 22 to drive the input of pass transistor 16 low and maintain this pass transistor in its conducting, low resistance state during normal operation.

During the test mode of operation, test clock signal 22 is driven low, by circuitry not shown, causing test clock signal buffer 20 to bias transistor 16 off, inserting a high impedance in series between VDD and row power buss 18. If there is any abnormal current leakage acting upon the cells connected to row power buss 18, the power supply voltage on row power buss 18 will sag or decay below a detectable trigger threshold.

A low current, normally conducting transistor, such as normal leakage current pass transistor 28, may be placed in parallel with pass transistor 16 as a pull up transistor to supply any normal or acceptable leakage currents that would exist in good or defect free circuits so that such acceptable leakages would not cause the detectable sag in the voltage on row power buss 18 during the test mode.

Transistor 30, included within each switching circuit 10, forms a portion of an input OR function which detects when the voltage on any of the row power busses drops below a threshold voltage. OR input transistor 30 is connected to VDD and provides a high voltage on output signal line 32 when the voltage on row power buss 18 sags or decreases below the threshold voltage of transistor 30. The operation of transistor 30 will be described in greater detail with reference to standard cell, semi-custom integrated circuit 12 shown in FIG. 2.

Figure 2:
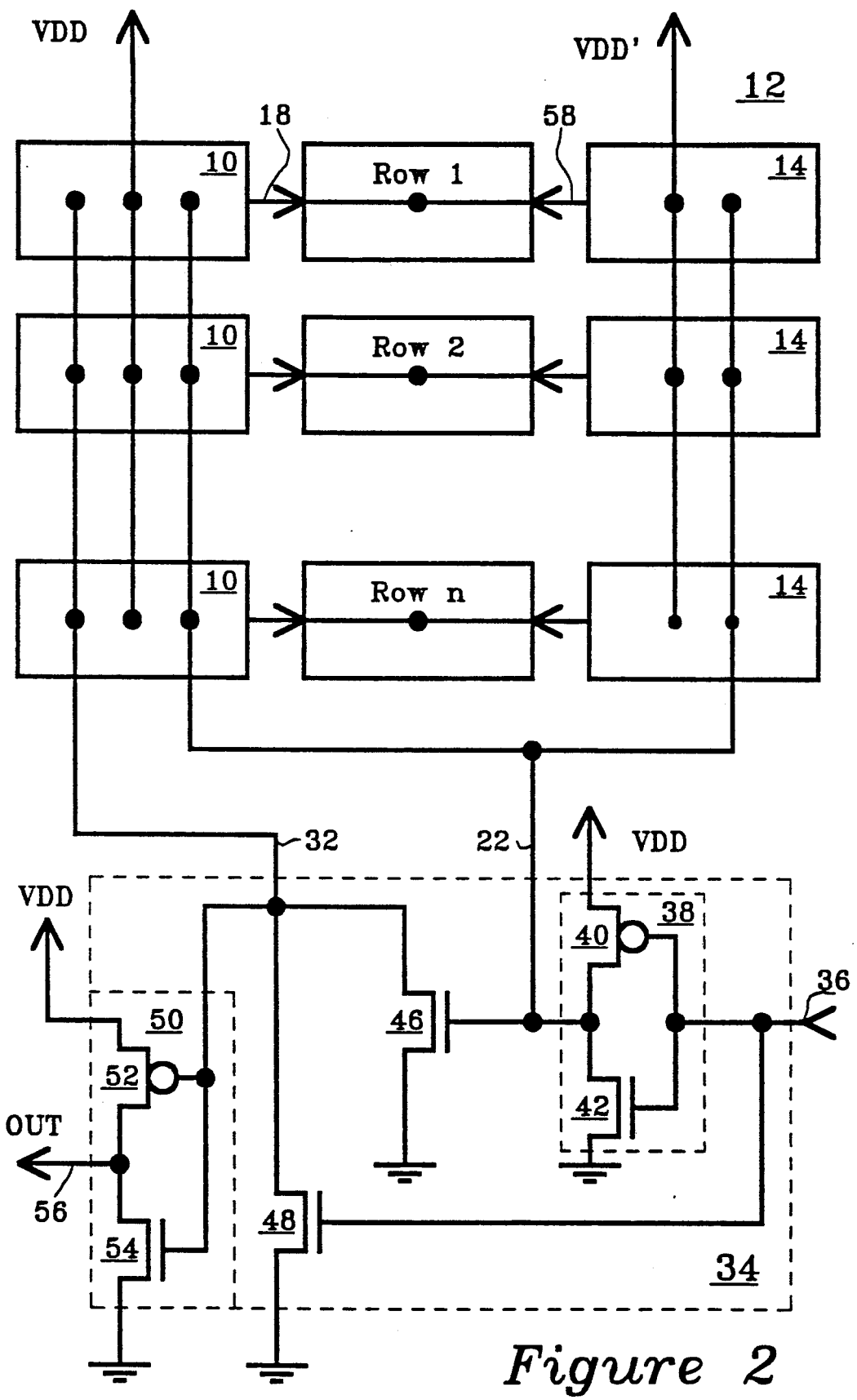
FIG. 2 is a schematic illustration of portions of standard cell, semi-custom integrated circuit 12 showing the use of a series of switching circuits 10 which combined with sensing circuit 34 provide BICT capabilities for each standard cell row.

Referring now to FIG. 2, standard cell, semi-custom integrated circuit 12 includes multiple rows of standard cells of circuitry which may be customized. Row 1, 2 and n are illustrated. Associated with each row is the switching portion of a test circuit, such as switching circuit 10. Each such switching circuit 10 is connected to VDD power and provides row power output to the appropriate row, such as Row 1, by row power buss 18.

Each such switching circuit 10 receives test clock signal 22 from test control circuit 34 as an input and provides output signal line 32 thereto. The operation of test control circuit 34 is described immediately hereinbelow.

Test control circuit 34 receives test initiation signal 36 as an input to activate the test mode of operation. Test initiation signal 36 is inverted and buffered by test clock initiation buffer 38, including transistors 40 and 42 connected between VDD and circuit ground, to generate test clock signal 22. Test clock signal 22 is also applied to large reset transistor 46 connected between output signal line 32 and circuit ground. Test initiation signal 36, without inversion by test clock initiation buffer 38, is applied to low current transistor 48 also connected between output signal line 32 and circuit ground. Output signal line 32 is applied as an input to OR output driver 50 which includes transistors 52 and 54 connected between VDD and circuit ground.

Large reset transistor 46 and low current transistor 48 serve to complete the OR function with transistors 30 in each switching circuit 10. In the test mode, test initiation signal 36 is clocked high. Test clock signal 22 is driven low by test clock initiation buffer 38 which causes large reset transistor 46 to stop conducting. Low current transistor 48 is caused to conduct directly by test initiation signal 36. Output signal line 32 may be amplified by OR output driver 50 by the appropriate choice of transistor sizes to increase the OR function sensitivity.

During the normal mode of operation, row power buss 18 provides VDD power directly to each row from VDD. During the test mode, row power buss 18 is disconnected from VDD by pass transistor 16, shown in FIG. 1, which is caused to stop conducting. Any leakage currents above those provided by normal leakage current pass transistor 28 in any particular row are sensed by transistor 30 in the associated switching circuit 10 and amplified by OR Output driver 50 to generate fault indicator signal 56.

Figure 3:
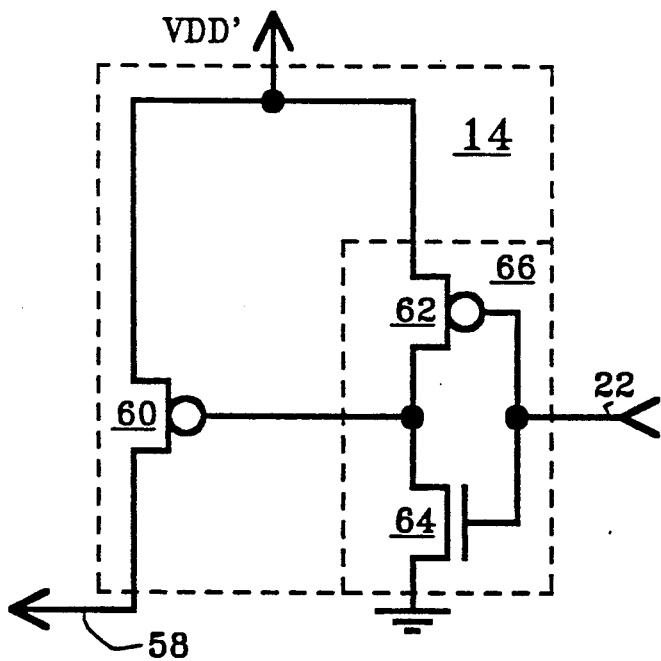
FIG. 3 is a schematic illustration of switching circuit 14 for use in standard cell, semi-custom integrated circuit 12, as shown in FIG. 2, when multiple primary power busses are required in any particular row of standard cells.

The circuitry described above with reference to FIGS. 1 and 2 is suitable for use in standard cell rows which require only one power buss. Standard cell rows which require multiple primary power busses may be accommodated by the inclusion of additional switching circuit 14, as shown in FIG. 3, for that row.

Referring again to FIG. 3, an additional switching circuit may be provided for each row, such as switching circuit 14. Switching circuit 14 receives test clock signal 22 as an input and is connected to the appropriate main power buss supply, such as VDD', which may be the same as VDD or different. Switching circuit 14 generates row power buss 58 as will be described immediately below.

Switching circuit 14 includes large pass transistor 60 connected between VDD' and row power buss 58. Pass transistor 60 is controlled by test clock signal buffer 66, which is similar to test clock signal buffer 20, shown in FIG. 1, and test clock initiation buffer 38 shown in FIG. 2. Test clock signal buffer 66 includes transistors 62 and 64 which operate to buffer and invert test clock signal 22 to control the state of pass transistor 60. Row power buss 58 is directly connected to row power buss 18 through the circuits of row 1.

A standard cell integrated circuit with BICT capabilities implemented according to the present invention includes, in addition to the normal standard cell circuitry, sensing circuit 34 and one or more switching circuits 10. If multiple power busses are required, the integrated circuit implemented according to the present invention also includes one or more additional switching circuits 14.

With regard now to the physical implementation of the present invention, sensing circuit 34 requires direct connection to VDD, the main power buss. The appropriate switching circuits are connected in series between VDD, the main power buss and each row power buss, such as row power buss 18 or row power buss 58.

Each standard cell semi-custom integrated circuit 12 including BICT capabilities requires only one sensing circuit 34. Sensing circuit 34 therefore may be positioned anywhere on the circuit chip where VDD is available. For example, sensing circuit 34 could be placed in the first cell of any row and connected in series between VDD and switching circuit 10. Switching circuit or circuits 10, and additional switching circuit or circuits 14, if required, may conveniently be placed at the ends of the rows of standard cells, with switching circuit 10 at one end and additional switching circuit 14 at the opposite end of a particular row.

In the normal mode of operation, test initiation signal 36 is low and pass transistors 16 and 60 are conducting, the OR function formed by output signal lines 32, reset transistor 46 and low current transistor 48 is held low and fault indicator signal 56 from OR output driver 50 is held high. VDD and/or VDD' flows through pass transistors 16 and 60 and row power busses 18 and 58, respectively, to each row as appropriate.

When circuitry within the standard cells is not changing state, the current requirement is dictated by the leakage characteristics of the circuit gates or other logic, which is relatively small. Circuit activity which requires the gates to switch states demands transient current pulses from VDD, and/or VDD', which flow through pass transistors 16 and 60.

The pass transistors then insert a low resistance in the power path between the supply voltage and the row buss that will be seen as a small reduction of the power supply voltage at the logic gate. The pass transistors should be sized to be large enough to minimize insertion loss to avoid substantial reduction of the speed of such logic gates. In a particular implementation, an 8.3 ma current caused a 0.20 V drop in voltage applied to the row. This insertion loss would result in a reduction of circuit speed due to the reduction of power supply voltage on the order of 10 to 20 percent.

An additional benefit of the impedance inserted by the pass transistors is to limit current spikes on the power busses and thereby reduce inductive switching noise.

In the test mode, the large pass transistors 16 and 60 are biased in cut-off so that row power busses 18 and 58 are supplied only through normal leakage current pass transistor 28. Defect or failure related current drains will cause row power busses 18 and 58 to change to a new value determined by the magnitude of the defect current and the sizing of leakage current pass transistor 28.

In a particular physical implementation of the present invention, defect currents greater than 10.7 $\mu$a will cause a row power buss voltage change of 1.0 volts. Switching circuit 10 may therefore be considered to be a voltage sensor that produces fault indicator signal 56 when the voltage on row power busses 18 and 58 drops one transistor threshold voltage drop below VDD.

Transient behavior of switching circuit 10 is dependent upon the magnitude of the defect current. The defect current must be high enough to discharge the capacitance of the relevant power buss before the defect can be detected.

While this invention has been described with reference to its presently preferred embodiment(s), its scope is not limited thereto. Rather, such scope is only limited insofar as defined by the following set of claims and all equivalents thereof.

What is claimed is:

1. An integrated circuit with built-in current testing, comprising:
   a plurality of rows of circuit components;
   main power buss means for distributing power within the integrated circuit;
   row power buss means for applying power from the main power buss means to each of said plurality of rows of circuit components in the integrated circuit;
   switching circuit means in the integrated circuit operable in a normal mode to provide a connection between the main and row power buss means and operable in a test mode to substantially isolate the main power buss means from the row power buss means; and
   control circuit means in the integrated circuit responsive to a predetermined voltage differential between the main and row power buss means in the test mode the detecting defect induced currents therein.

2. The integrated circuit claimed in claim 1, wherein the switching circuit means further comprises:
   pass transistor means operable in the normal mode to provide a low impedance connection between main and row power buss means; and
   pull up transistor means operable in the test mode to provide a high impedance connection between main and row power buss means.

3. The integrated circuit claimed in claim 1, wherein the control circuit means further comprises:
   a plurality of voltage sensitive switching circuits, each associated with a different portion of the integrated circuit; and
   OR function means for detecting defect induced currents in any of the portions of the integrated circuit in response to one of the plurality of switching circuits.

4. The integrated circuit claimed in claim 1, further comprising:
   additional main power buss means for providing additional supply voltages; and
   additional switching circuit means associated with each portion of the integrated circuit requiring more than one supply voltage for connecting the additional main power buss means thereto during the normal mode of operation.

5. A method of testing an integrated circuit for defect induced currents comprising the steps of:
   applying a supply voltage to the integrated circuit;
   applying power during a normal mode from the supply voltage to a plurality of circuit components in the integrated circuit through a switching circuit in the integrated circuit;
   operating the switching circuit in a test mode in which the plurality of circuit components are substantially isolated from the supply voltage; and
   detecting defect induced currents in the integrated circuit in response to a predetermined voltage differential between the supply voltage and the circuit components during the test mode.

6. The method of testing an integrated circuit claimed in claim 5, further comprising the steps of:
   biasing a pass transistor to conduct in the normal mode to provide a low impedance connection between supply voltage and the plurality of circuit components; and
   biasing a pull up transistor into conduction to provide a high impedance connection between the supply voltage and the plurality of circuit components during the test mode.

7. The method of testing an integrated circuit claimed in claim 5 wherein the step of detecting defect induced currents further comprises the steps of:
   providing a plurality of switching circuits, each associated with a different portion of the circuit components in the integrated circuit; and
   detecting defect induced currents in any of the portions of the integrated circuit associated with the plurality of switching circuits in response to the predetermined voltage differential between the supply voltage and that portion of the integrated circuit during the test mode.

8. The method of testing an integrated circuit claimed in claim 5, further comprising the steps of:
   connecting additional supply voltages to some portions of the integrated circuit through additional switching circuits during the normal mode of operation.

9. The integrated circuit claimed in claim 3 wherein the integrated circuit is a static CMOS logic circuit in which the logic signals do not change during the test mode and each of the voltage sensitive switching circuits further comprises:
   a transistor connected between the row and power buss means for operation in response to a voltage differential of about one transistor threshold voltage drop.

10. The method of testing an integrated circuit claimed in claim 7 wherein the integrated circuit is a static CMOS logic circuit in which the logic signals do not change during the test mode and the step of detecting defect induced currents further comprises the step of:
   connecting a transistor between the supply voltage and the circuit components for operation in response to a voltage differential therebetween of about one transistor threshold voltage drop.

* * * * *